United States Patent [19]
Brown et al.

[11] Patent Number: 5,818,269
[45] Date of Patent: Oct. 6, 1998

[54] DIFFERENTIAL CURRENT MODE DRIVER

[75] Inventors: Gary Brown, Fremont; John Andrew Campbell, Davis; Jitendra Mohan, Palo Alto, all of Calif.

[73] Assignee: National Semiconductor Corporation, Santa Clara, Calif.

[21] Appl. No.: 829,845

[22] Filed: Apr. 1, 1997

[51] Int. Cl.$^6$ .................................................. G01R 19/00
[52] U.S. Cl. .................... 327/108; 327/109; 327/112; 327/55
[58] Field of Search .................................. 327/108, 109, 327/112, 55, 538, 543

[56] References Cited

U.S. PATENT DOCUMENTS

| | | | |
|---|---|---|---|
| 4,536,662 | 8/1985 | Fujii | 327/270 |
| 5,376,833 | 12/1994 | Chloupek | 327/110 |
| 5,408,141 | 4/1995 | Devore et al. | 327/541 |
| 5,424,662 | 6/1995 | Bonaccio | 327/55 |

*Primary Examiner*—David C. Nelms
*Assistant Examiner*—Hien Nguyen
*Attorney, Agent, or Firm*—Limbach & Limbach L.L.P.

[57] ABSTRACT

A current mode driver capable of driving both 10 Base-T signalling and 100 Base-T signalling in a Local Area Network (LAN) includes two or four current sources. In a first embodiment, a differential signal generator drives four current sources. The generator outputs four signals, one of which is received by each current source. Using these signals, two of the current sources push or pull current across the load in one direction, while the other two current sources push or pull current across the load in the other direction, such that a full differential signal is generated across the load. In another embodiment, a signal generator drives two current sources which drive into the load one at a time. Two switches provide either high resistance or low resistance during half of a signal cycle such that current is pulled through the load in one direction, and prevented from flowing through the load in the other direction. When one current source turns on upon receipt of an input signal, one switch provides low resistance such that when the current source drives current into the load a voltage is generated across the load. At the same time, the other switch provides high resistance such that virtually no current is conducted. In this manner, only one current source pulls current across the load at a given time, while the other current source remains in a standby state.

28 Claims, 11 Drawing Sheets

DIFFERENTIAL CURRENT MODE DRIVER

BACKGROUND OF THE INVENTION

1. Field of the Invention

The present invention relates to the field of local area network communications, and in particular, to drivers in local area networks.

2. Related Art

A local-area network ("LAN") is a communication system that enables personal computers, work stations, file servers, repeaters, data terminal equipment ("DTE"), and other such information processing equipment located within a limited geographical area such as an office, a building, or a cluster of buildings to electronically transfer information among one another. Each piece of information processing equipment in the LAN communicates with other information processing equipment in the LAN by following a fixed protocol (or standard) which defines the network operation. Information processing equipment made by different suppliers can thus be readily incorporated into the LAN.

The ISO Open Systems Interconnection Basic Reference Model defines a seven-layer model for data communication in a LAN. The lowest layer in the model is the physical layer which consists of modules that specify (a) the physical media which interconnects the network nodes and over which data is to be electronically transmitted, (b) the manner in which the network nodes interface to the physical transmission media, (c) the process for transferring data over the physical media, and (d) the protocol of the data stream.

IEEE Standard 802.3, Carrier Sense Multiple Access with Collision Detection (CSMA/CD) Access Method and Physical Layer Specifications, is one of the most widely used standards for the physical layer. Commonly referred to as Ethernet, IEEE Standard 802.3 deals with transferring data over twisted-pair cables or co-axial cables. The 10 Base-T protocol of IEEE Standard 802.3 prescribes a rate of 10 megabits/second ("Mbps") for transferring data over twisted-pair cables.

The constant need to transfer more information faster, accompanied by increases in data processing capability, necessitated an expansion to data transfer rates considerably higher than the 10-Mbps rate prescribed by the 10 Base-T protocol. As a consequence, a protocol referred to as 100 Base-T was developed for extending IEEE Standard 802.3 to accommodate data moving at an effective transfer rate of 100 Mbps through twisted-pair cables. Under the 100 Base-T protocol, certain control bits are incorporated into the data before it is placed on a twisted-pair cable. The result is that the data and control signals actually move through a twisted-pair cable at 125 Mbps.

In expanding IEEE Standard 802.3 to the 100 Base-T protocol, there are various situations in which it is desirable that the transmitter be capable of using one driver to transmit data at both the 100 Base-T rate and the lower 10 Base-T rate. Accordingly, an apparatus is needed that can drive both 10 Base-T and 100 Base-T signalling.

In particular, one set of information processing equipment should be capable of driving data moving at the 10 Base-T rate or the 100 Base-T rate without having to make any adjustments when the data transfer rate changes from 10 Base-T to 100 Base-T and vice versa.

The difficulty in designing a circuit that can handle this dual signalling stems from the diverse signalling techniques employed. The 100 Base-T protocol specifies that the data be scrambled and provided with a trinary MLT-3 (multilevel transmit/three levels) coding before entering a twisted-pair cable. As a result, the 100 Base-T signalling has very fast edges. In contrast, the 10 Base-T signalling is more sinusoidal, operating at either 5 or 10 MHz.

FIG. 1 illustrates the data transmit path 100 of communication in the LAN. During data transmission, a communication unit operating on the LAN, such as a computer 117, generates a data signal T1 which is converted into differential form for transmission on the twisted pair cable 103. For 10 Base-T transmission, this data signal T1 is Manchester coded 101 to reduce electromagnetic interference and to produce square wave pulses. These pulses are then filtered 101 such that the square wave pulses are basically sinusoidal waves. These waves then go through a waveshaping filter to generate filtered differential data signals T1±. For 100 Base-T transmission, the data signal T1 is scrambled 119, converted to differential format 119, and MLT-3 coded 105 to generate trinary differential signals T2±. A 10 Base-T amplifier signal driver 107 and a 100 Base-T amplifier signal driver 109 take these differential signals T1± and T2±, respectively, and generate voltage-sourced differential signals T10± T20±, respectively, to drive a primary load 105 and to transmit them on the twisted pair cable 103.

Transformer 111 isolates the twisted-pair cable 103 from the circuitry producing the transmit signals. The transformer has a primary winding 111A and a secondary winding 111B. The primary winding 111A terminates at a primary load 105 and the secondary winding terminates at a secondary load 113. The secondary load couples to a connecting unit 115, which couples to the twisted-pair cable 103. The primary winding 111A couples to a resistive load 105. It is across this resistive load 105 that either sine wave 10 Base-T signalling or MLT-3 100 Base-T signalling must be created.

Presently, voltage driven amplifiers are used to drive either the 10 Base-T signalling or the 100 Base-T signalling but not both types of signalling. Two amplifiers comprise a pair of emitter-coupled output transistors configured in a push-pull arrangement. In a conventional push-pull amplifier, the collector of one of the output transistors is connected to a fixed positive DC voltage to provide a current source and the collector of the other of the output transistors is connected to a fixed negative DC voltage to provide a current sink. The positive and negative DC voltages are commonly referred to as the source and sink voltages, respectively. These voltages in turn drive the load corresponding to the primary side of the transformer. A problem with these voltage driven amplifiers is an impedance mismatch which causes power to be reflected from the load.

Typically, the transformer operates in a 1:2 voltage step-up mode with respect to the differential data signals. Due to the 1:2 voltage step-up, the 100 ohm characteristic impedance of the outgoing twisted pair cable is seen through the transformer as a 25 ohm reflected impedance. Thus, terminating resistors 105 are chosen to have such values that the total driving secondary load impedance, i.e., the combination of termination resistors 105 and the output impedance of voltage amplifiers, matches the 25 ohm reflected impedance. When a voltage source is driving the load resistor corresponding to the primary side of the transformer, the source typically has a fixed low output impedance. This impedance is hard to control during processing because the value typically is only about 2 ohms. For example, typically, in the push-pull voltage amplifier configuration, each amplifier has a fixed two ohm output resistance in series with an output resistor of 10.5 ohms to match the 25 ohm resistor load. Thus, if the fixed 2 ohm output impedance varies just a little bit, that is a significant portion of the 25 ohm load.

As a result, it is difficult to get the impedances of the voltage source and load to match in these voltage driven amplifiers.

Thus, a need exists for driving both 10Base-T and 100Base-T signalling high currents accurately and efficiently into a common load with high speed and low distortion.

SUMMARY OF INVENTION

A driver amplifier having high efficiency, high output current driving capability, and wide bandwidth is achieved by using current sources to drive high currents into the load corresponding to the primary side of the transformer.

A differential driver amplifier in accordance with a first preferred embodiment of the present invention includes a differential signal generator which drives four current sources. The signal generator outputs four distinct half-wave rectified signals wherein the first and second signals are 180 degrees out of phase from one another, and the third and fourth signals are opposite in phase from the second and first signals, respectively. Each of the current sources receives one of these signals. Using these signals, two of the current sources push or pull current into one end of the load, while the other two current sources push or pull current into the opposite end of the load, such that a full differential signal is generated across the load. In this embodiment, one current source drives another current source. A gain correction unit compensates for errors due to offset voltages in the transistors.

In a second preferred embodiment of the present invention, the integrated driver amplifier includes only two current sources which drive high currents into the load. One of the current sources sinks current while the other current source is in a standby mode. This circuit drives the load using two external resistors. These two external resistors tie to the voltage supply and provide two paths through which to pull current. Thus, this circuit must drive enough current to generate a voltage across not only the load resistor, but the two external resistors as well.

A third preferred embodiment of the present invention, includes a switching technique to reduce the amount of current required to generate a voltage across the load resistor. The circuit in this embodiment includes a differential current generator driving two current sources which drive the load one at a time. Two switches couple to either end of the load such that when one current source is active one of the switches pulls current through the load while the other switch provides high resistance to prevent current from flowing through the load in the other direction. As a result, only one current source sinks current while the other current source is in a standby mode. In an alternate configuration of this embodiment, the current sources are cross-coupled to further reduce the power required to operate the circuit.

The topology of the circuit includes two variable resistors functioning as switches such that one of the resistors has a lower value than the other during half of a signal cycle. The two variable resistors are voltage controlled, and the only real resistor in the circuit is the load resistor. Thus, the circuit only needs to pull enough current to generate a voltage across the load resistor. Internal biasing resistors can also be employed to set the value of the output when there is no current.

As a result of its architecture, this circuit has several advantages. It is dependent on component geometries and is largely independent of process, voltage, and temperature variations, enabling a reliable and controlled open-loop operation for maximum speed while being flexible with process variations. Additionally, output voltage is independent of the current steering mechanism so long as the current sources function in the desired operating region. The current steering logic path is short and fast for high speed and low distortion. This logic is generated directly from the output transistor control voltage, minimizing jitter caused by mismatched edges. As a result, the circuit achieves high efficiency by the use of a push pull configuration with current sources instead of voltage sources. Furthermore, it is possible to bias a current source very close to threshold even with zero quiescent current.

These and other features and advantages of the present invention will be understood upon consideration of the following detailed description of the invention and the accompanying drawings.

BRIEF DESCRIPTION OF THE DRAWINGS

Like reference symbols are employed in the drawings and in the description of the preferred embodiments to represent the same or similar items.

DETAILED DESCRIPTION OF THE INVENTION

Figure 1:
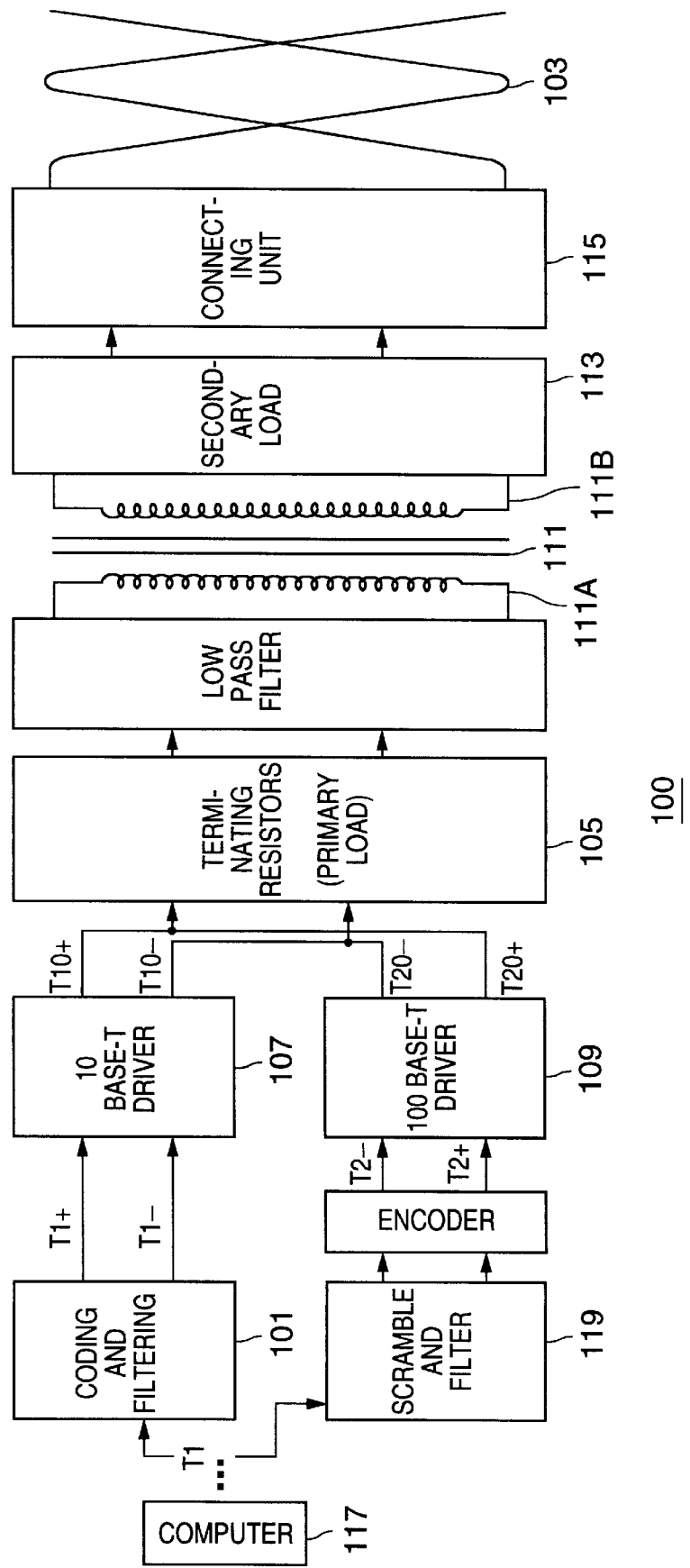
FIG. 1 shows a conventional LAN system configuration including a voltage amplifier driver.
Figure 2:
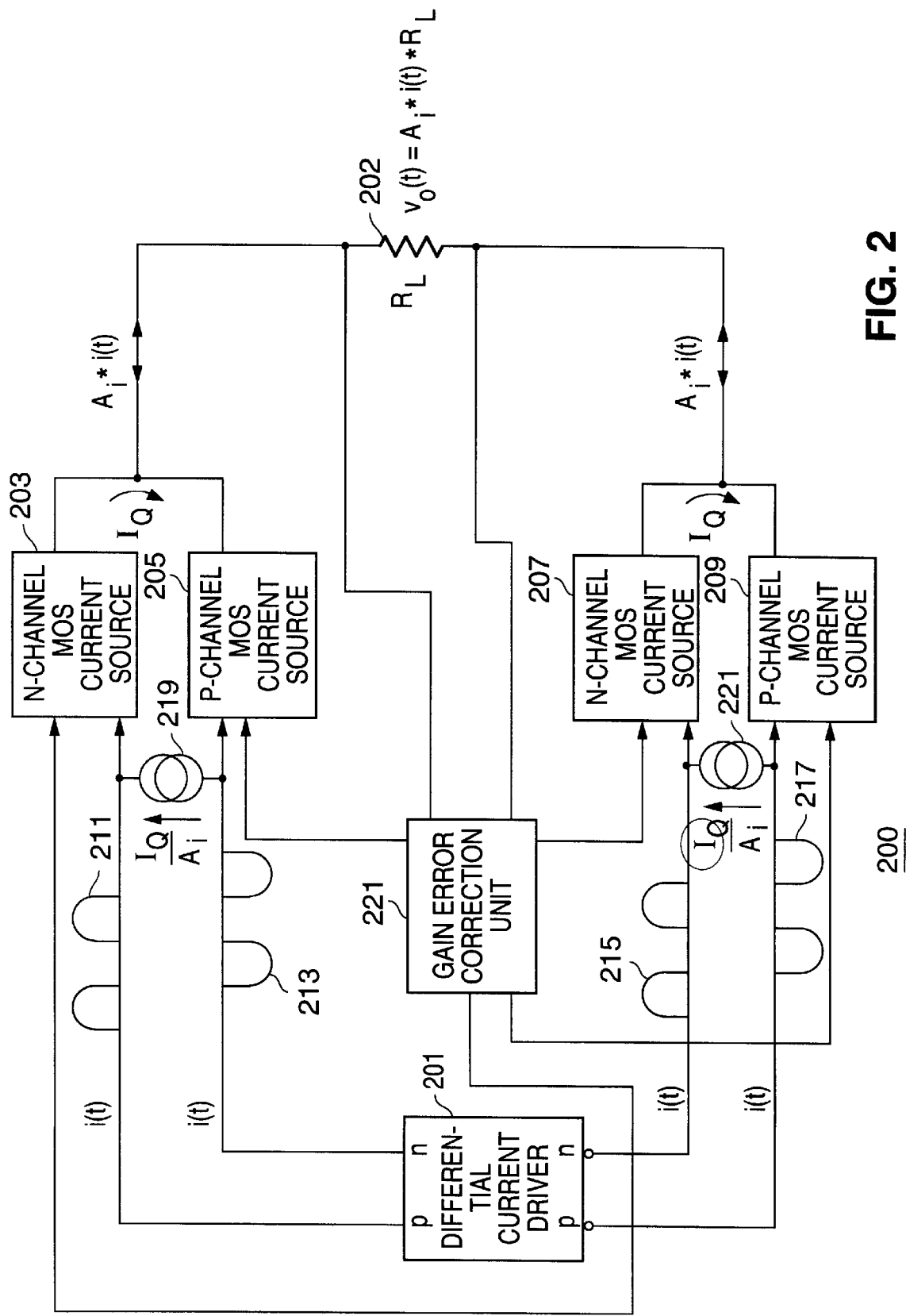
FIG. 2 is a schematic diagram of a first preferred embodiment of a differential current mode driver in accordance with the present invention.

In accordance with an illustrative embodiment of the invention, a current mode driver 200 capable of driving both 10BASE-T and 100BASE-T signalling is shown in FIG. 2. A transformer (not shown) isolates the twisted-pair cable (not shown) from the circuitry producing the transmit signals. The transformer has a primary winding and a secondary winding. A connecting unit is connectable to a pair of lines of an outgoing twisted-pair cable so as to electronically couple the cable to the secondary winding of the transformer. The secondary winding terminates at the cable, which has a characteristic impedance of 100 ohms. The primary side of the transformer terminates at a load resistor having an impedance of 100 ohms to match the 100 ohm characteristic impedance of the twisted pair cable. It is across this resistor that either 10 Base-T sine wave signalling or 100 Base-T MLT-3 signalling must be created. The purpose of the invention is to replicate these signalling waves across the resistor load by generating a voltage across the resistor.

$$Vo(t) = A_i * i(t) * R_L.$$

where Vo(t) is the voltage across the resistor, $A_i$ is the gain of the signal, i(t) is the current flowing through the resistor, and $R_L$ is the resistance of the load.

In the following description, a pair of differential signals means two signals whose current waveforms are out of phase with one another. The individual signals of a pair of differential signals are indicated by reference symbols respectively ending with "+" and "−" notation-e.g., S+ and S−. The composite notation "±" is employed to indicate both differential signals using a single reference symbol-e.g., S±.

Referring to FIG. 2, a differential current driver 201 drives four current sources 203, 205, 207, 209. The first current source 203 and the third current source 205 are N-channel MOS current sources, and the second current source 207 and the fourth current source 209 are P-channel MOS current sources. The current driver 201 outputs four half-wave rectified signals 211, 213, 215, 217. The first current signal 211 and the second current signal 213 are 180 degrees opposite in phase from one another. The two other currents 215, 217 that are output from the differential current driver flow through an inverter, such that the third current signal 215 is the inverse of the second current signal 213, and the fourth current signal 217 is the inverse of the first current signal 211. The outputs of the first and second current sources 203 and 205 couple together to differentially drive one end of the load. The outputs of the third and fourth current sources 207 and 209 couple together to differentially drive the other end of the load. The result is a full differential signal across the resistive load.

Typically, in a push-pull current mode arrangement the output trails the input by a voltage drop equal to $V_{TH}+\Delta V_{GS}$, where $V_{TH}$ is the threshold voltage of the transistors and $\Delta V_{GS}$ is the voltage drop from the gate of the transistor to the source. However, in a preferred embodiment of the present invention, the push-pull stage is biased into slight conduction by applying bias currents from the P-channel MOS current sources to the N-channel MOS current sources. This enables the transistors to be biased at the threshold voltage ($V_{TH}$), such that the output only trails the input by $\Delta V_{GS}$, rather than $V_{TH}+\Delta V_{GS}$. A small quiescent current source 219 is coupled between the inputs of the first and second current sources 203, 205 while another small quiescent current source 221 is coupled between the inputs of the third and fourth current sources 207, 209. The currents from these small quiescent current sources have a value of $i_Q/A_i$, where $A_i$ is the small signal gain of each of the current sources 203, 205, 207, 209. Thus, when the current $i_Q/A_i$ is amplified by $A_i$ upon flowing through the current sources, the result is an output bias current $I_Q$ which flows from each N-channel MOS current source to the P-channel MOS current source. This output bias current is equal to:

$$I_Q = i_Q/A_i * A_i = i_Q$$

Thus, when a small quiescent current is input to the circuit, the circuit goes to saturation rather than turning off. This is advantageous in that, with this circuit topology, even with a small quiescent current similar voltage levels can be established. For a conventional voltage driven amplifier to achieve similar distortion levels, much higher quiescent currents are required.

Figure 2A:
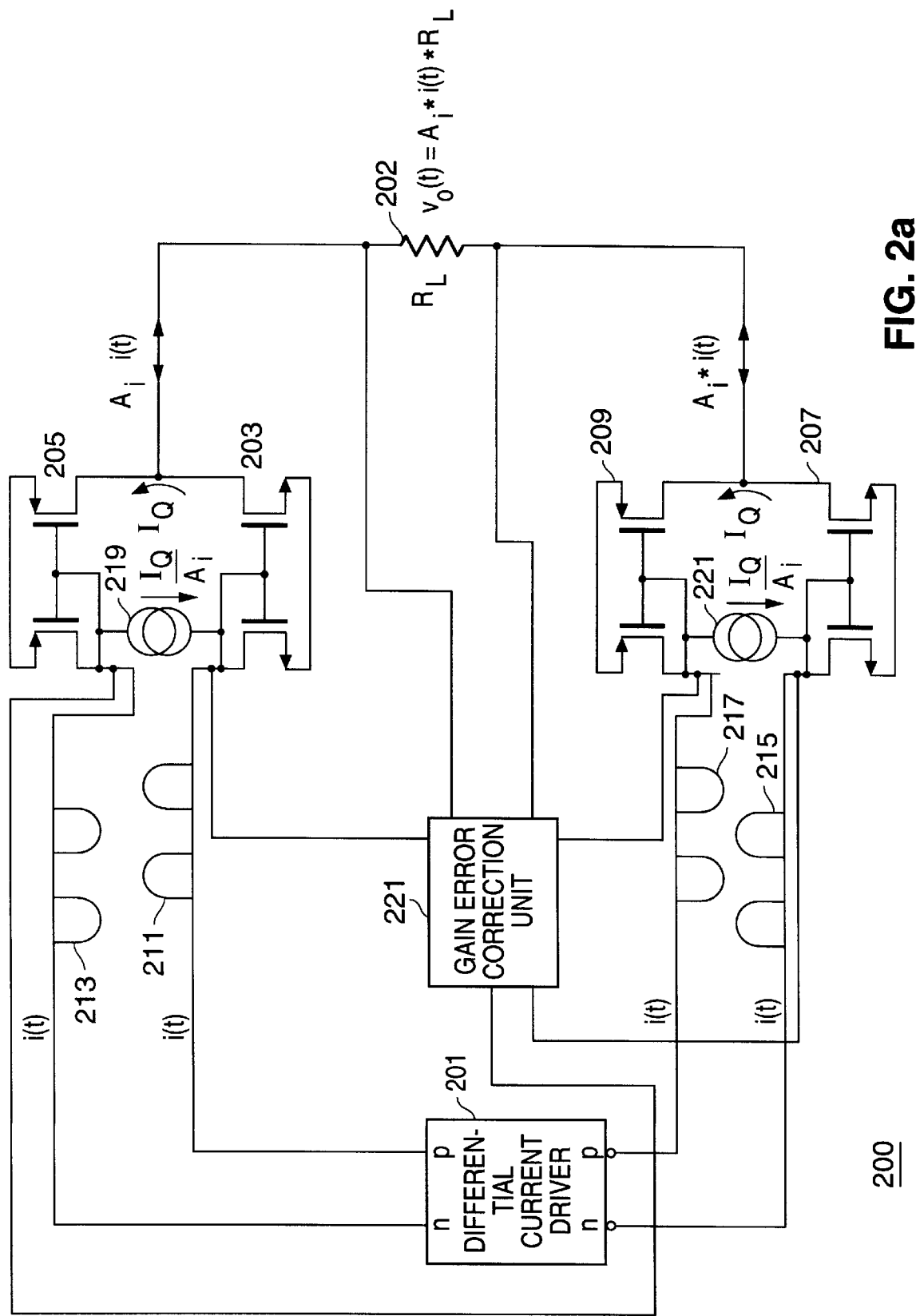
FIG. 2a is an alternative schematic diagram of a first embodiment.

As shown in FIG. 2a, the four current sources 203, 205, 207, 209 can be current mirror current sources. Though conventional current mirror circuits are depicted, it also will be appreciated that other types of current sources may be used. The outputs of current source 205 and current source 203 couple together, and bias current source 219 couples between the inputs of the two current sources 203, 205. Similarly, the outputs of current source 207 and current source 209 couple together, and bias current source 221 couples between the inputs of the two current sources 207, 209.

The use of four current sources to differentially drive the load may produce errors due to offset voltages within each of the transistors. The current mode driver circuit 200 operates such that two current sources are in series. One of the current sources driving into the top end of the load, drives into one of the current sources driving into the bottom end of the load i.e., one current source drives into another current source. When these two current sources are not matched, errors can result due to offset voltages within each of the transistors. To eliminate this error, the circuit includes a correction circuit 221 to detect any offset errors across the load resistor 202 and input correction factors into each of the current sources 203, 205, 207, 209 as needed.

A significant advantage of this circuit over the prior art is the high output impedance of the current sources. Typically, the transformer operates in a 1:2 voltage step-up mode with respect to the differential data signals. Due to this 1:2 voltage step-up, the 100 ohm characteristic impedance of the outgoing twisted pair cable is seen through the transformer as a 25 ohm reflected impedance. The conventional voltage amplifiers have a voltage source driving the load resistor, where the voltage source typically has a fixed low output impedance. This impedance is hard to control during processing because the value typically is only about 2 ohms. This output resistance is in series with an output resistor of 10.5 ohms to match the 25 ohm resistor load. Thus, if the fixed 2 ohm output impedance varies just a little bit, such variance represents a significant portion of the 25 ohm load. As a result, it is difficult to get the voltage source to match the load in these voltage driven amplifiers, thereby resulting in power losses in the circuit.

In contrast, the current sources of the preferred embodiments have very high output impedances. Thus, when the current source is placed in parallel with a small valued resistor, typically 50 ohms, the impedance from the resistor is insignificant. This configuration permits the current source to vary considerably without altering the 50 ohm value. Therefore, the line stays matched just based on the value of the load resistor. The ability to alter the value of the resistor to match the load provides significant control over the circuit. Additionally, because the source and the load of the transformer can be more accurately matched, impedance mismatch is not a problem as it is in the voltage amplifier circuits.

Although this circuit design provides the capability of driving both 10 Base-T and 100 Base-T signalling high currents accurately and efficiently into a load with high speed and low distortion, it does so at the expense of a relatively complex circuit design requiring four current sources 203, 205, 207, 209, high voltage requirements (5 volts rather than 3 volts are required) and concerns about process variations.

Figure 3:
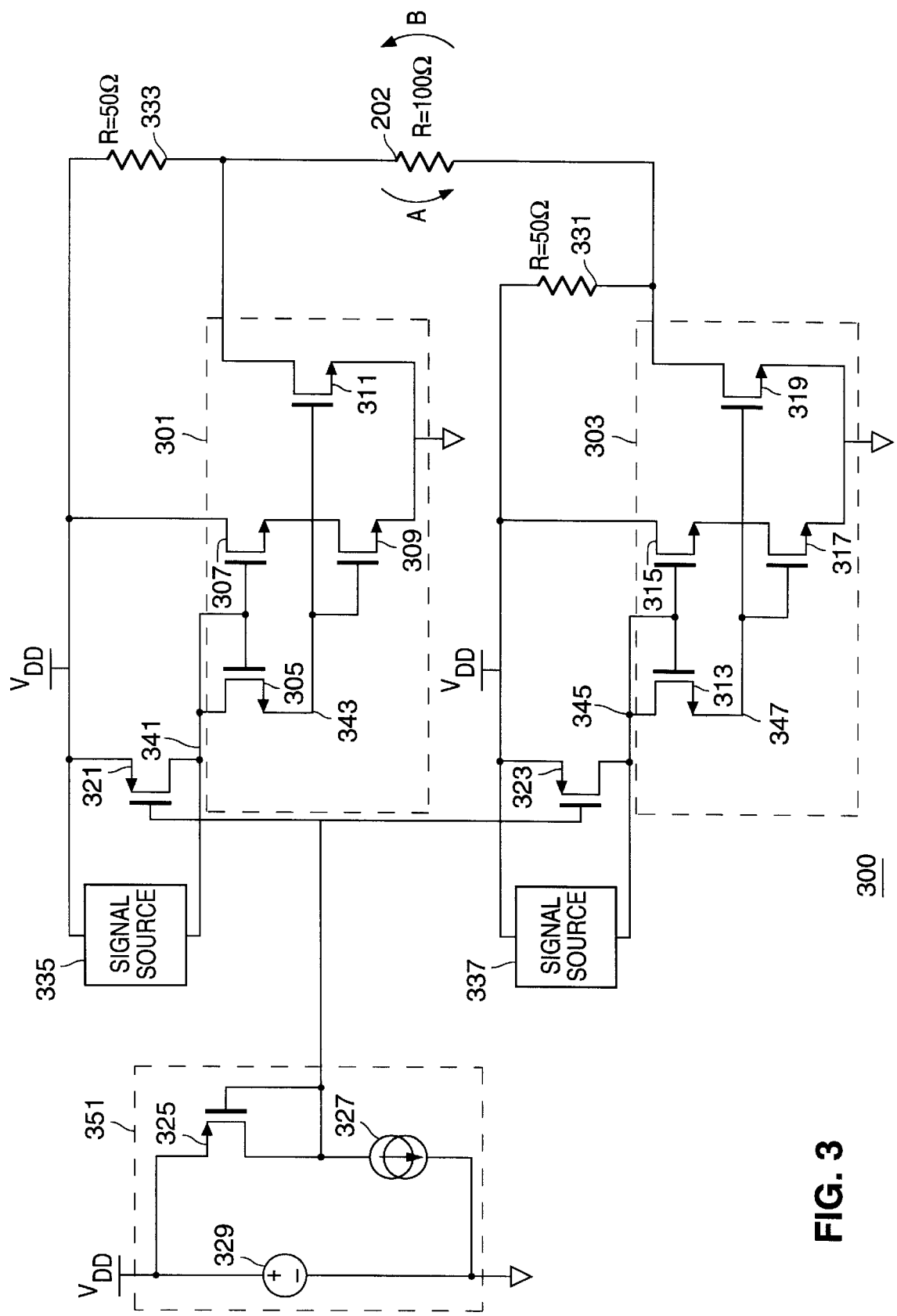
FIG. 3 is a schematic diagram of a second preferred embodiment of a differential current mode driver in accordance with the present invention.

FIG. 3 illustrates an alternate embodiment of the present invention where a more efficient current mode driver 300 uses only two current sources 301 and 303 to generate a voltage across the 100 ohm resistive load 202. The first current source 301 is a stacked current mirror circuit which simultaneously achieves wide bandwidth and low voltage operation. Though N-channel MOS components are depicted, it will be appreciated that the same principles can be implemented using P-channel MOS components or bipolar components. Furthermore, although a stacked current mirror circuit is depicted, it also will be appreciated that other types of current sources may be used.

A first pair of N-channel MOS transistors 305, 307 couple together in a mirrored configuration. The drain of transistor 305 couples to a reference node 341 (current source), P-channel MOS transistor switch 321, and to its gate. The gates of transistors 305 and 307 couple together and their gates couple to a first common node 343. The drain of transistor 307 couples to a voltage supply $V_{DD}$.

A second pair of N-channel MOS transistors 309 and 311 also couple together in a mirrored configuration. The source of transistor 305 couples to the first common node 343 and to the gates of transistors 309 and 311 which couple together. The sources of transistors 309 and 311 couple to circuit ground. The drain of transistor 311 couples to one end of the load 202 and external resistor 333 which couples to the voltage supply $V_{DD}$. The circuit utilizes two external resistors 331 and 333, which have preferred values of 50 ohms and tie to the voltage supply $V_{DD}$, to provide two paths to pull current through the circuit. Thus, the circuit 300 must drive enough current to generate enough current across not only the load resistor but across the external resistors 331, 333 as well.

The second current source 303 is also a stacked current mirror circuit, and is configured in the same manner. A first pair of N-channel MOS transistors 313, 315 couple together in a mirrored configuration. The drain of transistor 313 couples to a reference node 345 (current source), P-channel MOS transistor switch 323, and to its gate. The gates of transistors 313 and 315 couple together and the sources of transistors 313 and 315 couple to a common node 347. The drain of transistor 315 couples to the voltage source $V_{DD}$.

A second pair of N-channel MOS transistors 317, 319 also couple together in a mirrored configuration. The drain of transistor 317 couples to the common node 347 and to its gate. The gates of transistors 317 and 319 couple together and their sources couple to circuit ground. The drain of transistor 319 couples to one end of the load and external resistor 331 which couples to the voltage supply $V_{DD}$.

Signal generators 335 and 337 provide input signals $I_{IN\pm}$ to current sources 301 and 303, respectively. The input signals $I_{IN\pm}$ are half-wave rectified, and 180 degrees out of phase from one another, i.e., $I_{IN+}$ is 180 degrees out of phase from $I_{IN-}$. As a result, when the current source 301, 303 receives a signal, that particular current source becomes active, and when it does not receive a signal the current source is in a standby mode where only a small quiescent current flows through the current source keeping the current source in saturation rather than turning off. The effect of this arrangement is for current sources 301 and 303 to alternate between "active" and "standby" states, such that only one current source is active at a given time.

The configuration of the signal generators 335, 337 is as follows. The first input signal generator 335 couples to the voltage supply $V_{DD}$ and to the drain of transistor 305, which is the input of the first current source 301. The second input signal generator 337 couples to the voltage supply $V_{DD}$ and to the drain of transistor 313, which is the input of the second current source 303.

The two P-channel MOS transistors 321 and 323 are used as switches to switch between the first current source 301 and the second current source 303. The drain of transistor 321 couples to at the drain of transistor 305, which is the input of the first current source 301. The source of transistor 321 couples to the voltage source 339. The drain of transistor 323 couples to the drain of transistor 313, which is the input of the second current source 303. The source of transistor 323 couples to the voltage supply $V_{DD}$. The gates of both transistors 321 and 323 are coupled together and to the bias circuit 351.

The bias circuit 351 has a P-channel MOS transistor 325, a voltage source 329 and a DC current source 327. The bias circuit 351 provides a quiescent current and operates to reduce jitter which may be introduced by the circuit components. Each transistor has a threshold voltage which must be attained before it will begin sinking or sourcing a current. If a gate voltage is taken all the way to zero volts (for N-channel MOS gates) to effectively shut off an NMOS transistor, then when it is desired to turn that NMOS device back on, that threshold voltage must be overcome before the transistor can begin to function and draw current and pull its output down. To overcome a potential jitter problem due to overcoming threshold voltages, a desired solution is to ensure that the waveform for the output gates never goes to zero volts. The gate voltage will approach the source voltage, to approximately the threshold value. Thereafter, when attempting to turn the device back on, very little delay is introduced into the output response and threshold voltage induced jitter is minimized.

By using threshold bias circuit 351, gate voltages are maintained very close to threshold levels which permit rapid response to an input signal, reducing jitter and providing a truer output response. The topology of the bias circuit 351 is as follows. The source of transistor 325 couples to the voltage supply $V_{DD}$ and the positive terminal of the voltage source 329. The drain and gate of the transistor 325 couple together, to the current source 327, and to the gates of P-channel MOS transistors 321 and 323. The DC current source 327 couples between the drain of transistor 325 and circuit ground. The P-channel MOS transistor 325 pulls a bias current which is mirrored by the two P-channel MOS transistors 321, 323.

Figure 10:
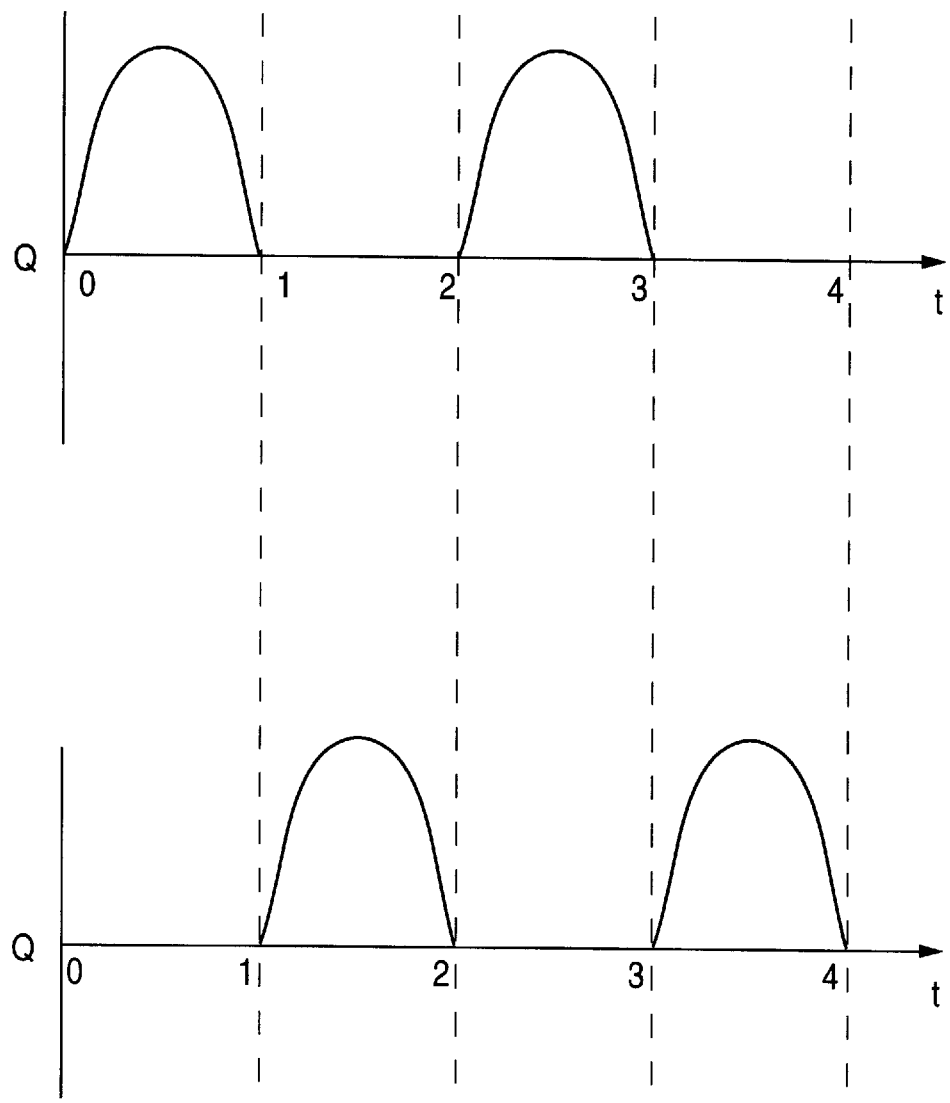
FIG. 10 is a timing diagram of the waveforms of input signals $I_{IN\pm}$ as used in the circuits of FIGS. 3–9.

Referring to both FIGS. 3 and 10, the operation of the current mode driver circuit 300 will now be explained. As illustrated in FIG. 3, signal $I_{IN+}$ is input into current source 301, and signal $I_{IN-}$ is input into current source 303. FIG. 10 is a simplified timing diagram which illustrates the waveforms of the input signals $I_{IN\pm}$ as a function of time. For one half of a signal cycle, between time t0 and t1 shown in FIG. 10, signal $I_{IN+}$ has a positive waveform above a DC quiescent current value Q, which therefore shifts current source 301 from a standby to an active state, and signal $I_{IN-}$ has no waveform which therefore keeps current source 303 in a standby mode. When current source 301 is active, the external resistors 331, 333, which are tied high, pull current through the circuit 300 and the load 202. When the circuit 300 operates in this manner, it provides a voltage drop, proportional to the current flow, across the load resistor in the direction indicated by arrow A. For the other half of the signal cycle, between time t1 and t2 as shown in FIG. 10, current source 303 is active and current source 301 is in standby mode. When current source 303 is active, the external resistors 331 and 333 pull the current through the circuit and across the load 202. When the circuit 300 operates in this manner, it provides a voltage drop across the load resistor 202 in the direction indicated by arrow B. The result is an effective maximum voltage swing which is twice that typically realized and a composite output waveform across the load resistor 202.

In this embodiment, the 10 Base-T signals and the 100 Base-T signals can be injected into the current sources 301 and 303 in two locations. In a preferred embodiment, the 100 Mhz 100 Base-T signal is injected into the current sources at nodes 341 and 345, and the 10 Mhz 10 Base-T signal is injected into the current source at nodes 343 and 347.

This circuit has several advantages over the circuit of the second embodiment shown in FIG. 2. One advantage is that the circuit requires only two current sources. In the previous embodiment, two current sources would sink while the other two current sources would source. In this embodiment, one current source sinks while the other current source is in standby mode. This advantage, combined with the advantage of only one current source, as opposed to two current sources, being active at any given time, minimizes the power consumption of the circuit. Additionally, since the circuit requires only two current sources, as opposed to four current sources, less switching is involved which further limits the power consumption. Another advantage of this circuit 300, as mentioned in the previous embodiment, is that the current sources have high output impedances, thereby avoiding impedance mismatches between the current source and the load.

This embodiment is an improvement over the embodiment of FIG. 2 because no longer are four current sources required to operate the circuit. Rather, only two current sources are required, which eliminates the need for the gain error correction circuit. However, there are some drawbacks to this topology as well. When half of the circuit is active, one of the external resistors 331, 333 tied to $V_{DD}$ pulls a current through the circuit 300. The current splits off in two places, through one of the external resistors 331, 333 and through the load resistor 202. Thus, the circuit 300 must drive enough current to generate a voltage across all three resistors, both the load resistor and the external resistors 331, 333. Since the circuit 300 must drive all three resistors, this arrangement results in the consumption of more current than is actually required to generate the voltage to drive the load 202.

Figure 4:
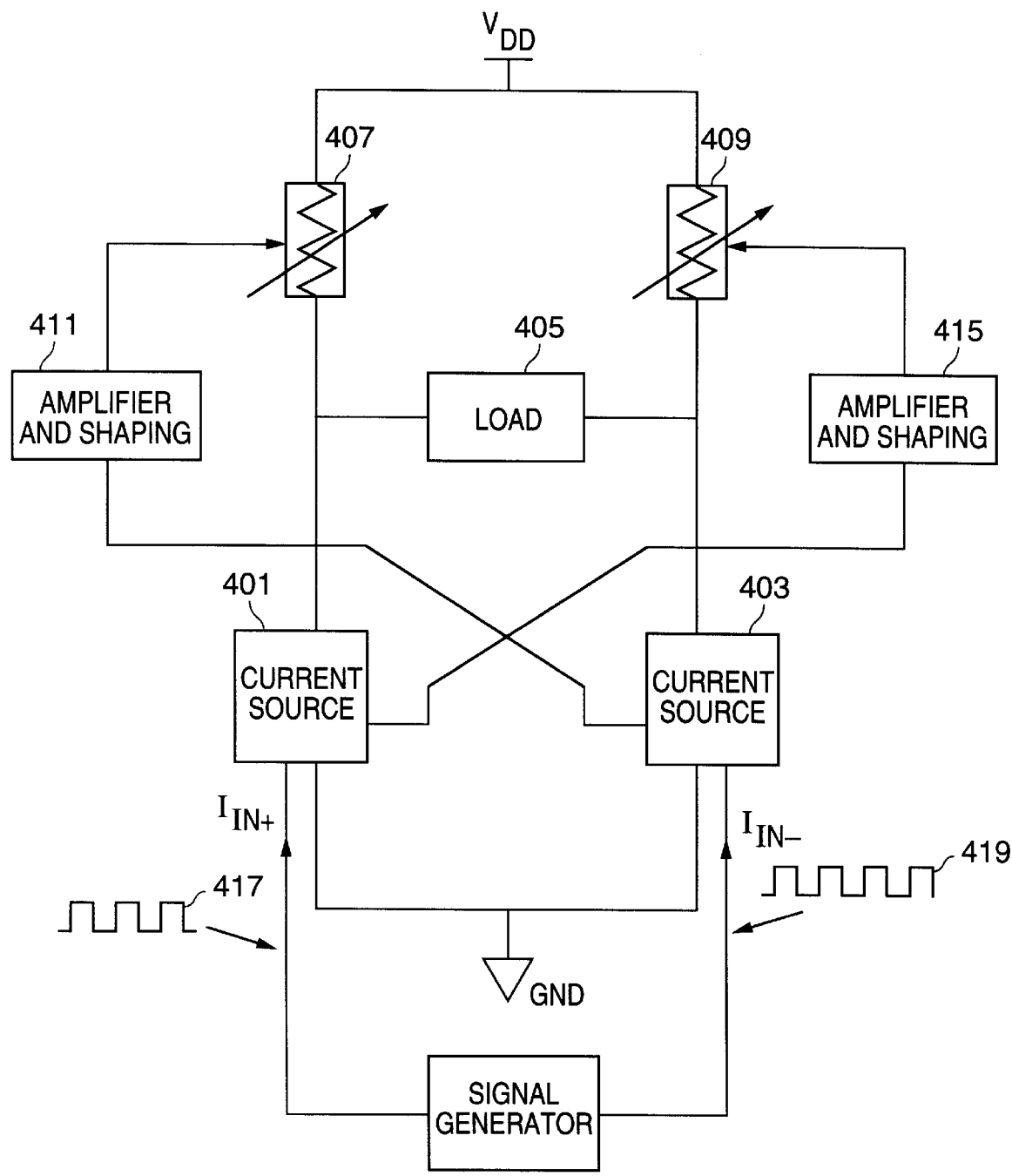
FIG. 4 is a schematic diagram of a third preferred embodiment of a differential current mode driver in accordance with the present invention.

FIG. 4 illustrates yet another current mode driver circuit 400 which has lower current consumption than the current mode driver circuit 300 of FIG. 3. In FIG. 4, the two signal generators 335 and 337 of FIG. 3 provide two half-wave rectified differential (180 degrees out of phase from one another) signals $I_{IN\pm}$, where signal $I_{IN+}$ is input to the first current source 401, and signal $I_{IN-}$ is input into the second current source 403. As a result, current sources 401 and 403 function similar to current sources 301 and 303 of FIG. 3, such that only one current source 401, 403 is active at a given time. Both of these current sources 401 and 403 operate one at a time to provide current to generate a voltage across a resistive load 405, where the preferred resistor value is 50 ohms. In this embodiment of FIG. 4, the current sources 401 and 403 are cross-coupled to eliminate the distortion created during the operation of the circuit.

Each of the current sources 401 and 403 couples to one of the variable resistors 407, 409, where one of the resistors has a lower value than the other during half of a signal cycle. Thus, these two variable resistors 407 and 409 can function as switches, where during one half of a signal cycle one resistor 407, 409 has very high resistance such that it effectively operates as an open circuit while the other resistor 409, 407 has a low resistance such that it effectively operates as a short circuit conducting current through the resistive load. One resistor 407 couples to one end of the load 405 and the other resistor 409 couples to the other end of the load 405. The circuit operates such that resistor 407, 409 can provide a connection with either the power supply $V_{DD}$ or a current source 401 or 403. Thus, when one current source 401 or 403 is active, one of the resistors 407, 409 provides low resistance such that the active current source 401, 403 is driving current into the load 405 in one direction, whereas the other resistor 409, 407 provides high resistance, such that no current flows through the load 405 in the opposite direction.

The amplifier and shaping stages 411, 415 determine how much resistance is required in helping to pull current across the load 405. In alternate embodiments of the current mode driver 400 (described below), resistors 407 and 409 are illustrated as voltage-controlled switches (e.g., MOSFETs). As a result, the amplifier and shaping stages 411, 415 amplify a control voltage to activate the large voltage controlled switches to pull current through the load 405, and shape the current by providing waveforms generated by the on and off switching of the switches.

For example, when the first current source 401 is active the second current source 403 is in a standby mode (due to the differential phases of their input signals $I_{IN+}$ and $I_{IN-}$ respectively), and resistor 407 provides low resistance and thus, connects with the power supply $V_{DD}$ to pull current from the first current source 401 through the load resistor 405. At the same time, the other resistor 407 provides high resistance and thus, conducts virtually no current. When the current source 403 becomes active (and, therefore, the first current source 401 is in a standby mode), resistor 407 provides a low resistance and resistor 409 provides a high resistance.

The current mode driver circuit 400 is efficient in that it drives only one resistor, the load resistor 405. As a result, the circuit 400 does not need to expend excess current to drive the load resistor 405 as does the current mode driver circuit 300 depicted in FIG. 3 which has to drive the load resistor 202 as well as two external resistors 331, 333. Instead, current mode driver circuit 400 employs a transistor switching technique to provide a path to pull the current through the load resistor 405.

Figure 5:
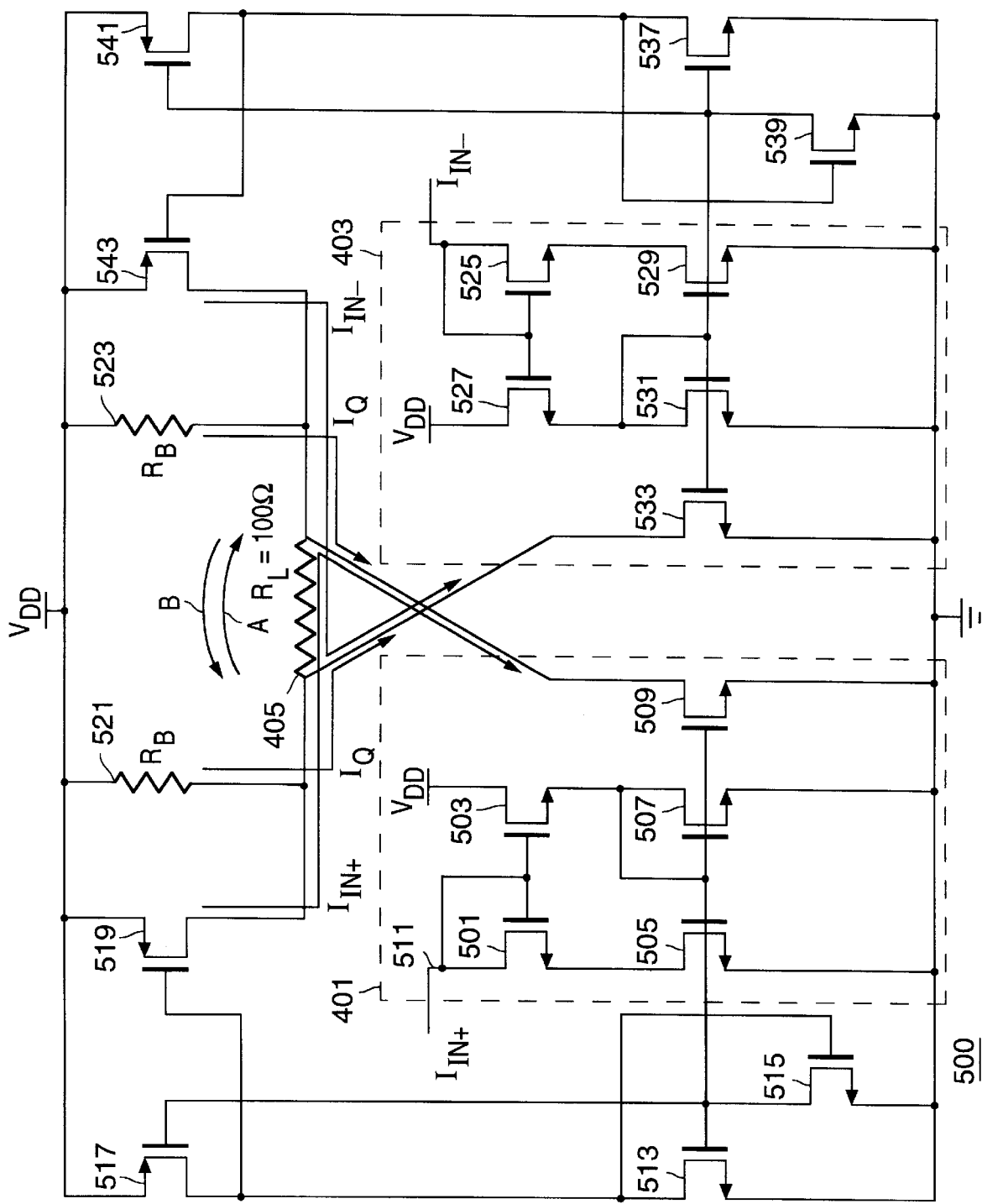
FIGS. 5–9 are schematic diagrams of alternate embodiments of a differential current mode driver in accordance with the present invention.

FIG. 5 illustrates the schematic diagram and the current steering mechanism of the current mode driver circuit 400 of FIG. 4. Referring again to FIG. 10, the timing diagram which illustrates the waveforms of the input signals $I_{IN\pm}$ as a function of time, in conjunction with FIG. 5, the operation of current mode driver circuit 500 will now be explained. As illustrated in FIG. 5, signal $I_{IN+}$ is input into current source 401, and signal $I_{IN-}$ is input into current source 403. For one half of a signal cycle, between time t0 and t1 as shown in FIG. 10, signal $I_{IN+}$ has a positive waveform above a DC quiescent current value Q, which shifts current source 401 from a standby to an active mode, and signal $I_{IN-}$ has no waveform which therefore keeps current source 403 in standby mode. When the first current source 401 is active, the left half of the circuit 500 provides a voltage drop across the load resistor 405 in the direction indicated by arrow A. For the other half of the signal cycle, between time t1 and t2 as shown in FIG. 10, current source 403 is active and current source 401 is in standby mode. When the second current source 403 is active, the right half of the circuit 400 provides a voltage drop across the load resistor 405 in the direction indicated by arrow B, such that a complete waveform is generated across the load. The two current sources 401 and 403 comprise modified Wilson current mirror circuits for increased bandwidth. However, it will be appreciated that other types of current sources may be used.

Referring to the left half of the circuit, transistors 501, 503, 505, 507, 509, 511 make up the first current source 401. The drain of transistor 501 couples to the reference node 511 which conducts the signal $I_{IN+}$. The gate of transistor 501 couples to its drain and to the gate of transistor 503. The drain of transistor 503 couples to the voltage source $V_{DD}$. The source of transistor 501 couples to the drain of transistor 505. The drain of transistor 507 couples to its gate and the gate of transistor 505. The sources of both transistors 505 and 507 couple to circuit ground. The gates of transistors 501 and 503 couple together and the gates of transistors 505 and 507 couple together, as well as to the output transistor 509. Only transistor 509 is used at the output to maximize voltage swing. The drain of transistor 509 couples to one end of the load 405, and its source couples to circuit ground.

In this configuration, during one half of a signal cycle, between t0 and t1, and between t2 and t4 as shown in FIG. 10, the left half of the current mode driver circuit 400 is active. The modified Wilson current source 401 operates such that the input current flows from the reference node 511. The input current flowing through transistors 501 and 505, and the output current flowing through transistors 505 and 507 are related in accordance with a fixed aspect ratio of transistors 501 and 503. The output current is then mirrored by transistor 509.

A control voltage is sensed off the gate of transistor 509 to control transistors 513, 515, 517, 519, which amplify and shape signal $I_{IN+}$. The gates of transistor 513 and transistor 509 couple together and to the drain of transistor 515. The gate of transistor 515 couples to the drain of transistor 513, and the sources of both transistors 513 and 515 couple to ground. With this topology, the control voltage sensed off the gate of transistor 509, turns on transistor 513. By providing transistors 513, 515 and 517 in a feedback arrangement, once this half of the circuit 400 is active (i.e., when current source 401 is active), transistor 513 turns on, which turns on transistor 515, which turns on transistor 517. Transistors 513, 515, and 517 amplify the control voltage with high gain sufficient to turn on large output transistor 519.

The switching function of resistor 409 of FIG. 400 is performed by a large P-channel MOS transistor 519 in parallel with resistor 521, which has a preferred value of 1000 ohms. This large MOS transistor 519 is used as a voltage-controlled analog switch which provides low resistance when it is in the "on" state, and extremely high resistance when it is in the "off" state. When this switch is on, it passes a signal through to the load resistor, and when it is off, the switch functions as an open circuit. The resistance is controlled by the gate voltage of the transistor 519. Thus, this transistor 519, is turned on upon receipt of voltage from amplifying transistors 513, 515 and 517. The drain of transistor 513 and the gate of transistor 515 couple to the drain of transistor 517 and to the gate of transistor 519. The sources of transistor 517 and transistor 519 couple to voltage source $V_{DD}$. The drain of transistor 519 couples to the opposite end of the load 405 as does the output transistor 509.

This switching on of transistors 513, 515, and 517 to turn on transistor 519, happens quickly to avoid delays. Once transistor 519 turns on, the transistor 519 pulls current through the resistive load 405. Additionally, the voltage drop across resistor 521 creates a small quiescent current $I_Q$ that also flows through the load. The switching technique is what determines which half of the circuit 400 is active. When the left half of the circuit 400 is active, the right half is in standby mode. Accordingly, as soon as the second current source 403 is active, the first current source 401 is in standby mode because no longer is the voltage applied to the switching transistor 519 sufficient to turn it on. As a result, transistor 519 functions as an open circuit thereby providing high resistance such that virtually no current is conducted across the load except the quiescent current IQ flowing from resistor 521. Transistor 519 sets up resistance to quickly turn on and off the current sources 401 so as to minimize distortion.

Similar to the embodiment depicted in FIG. 3, the switching mechanism of the current mode driver 400 also reduces the power required to operate the circuit by half since only half of the circuit is operating at one time. Additionally, the substitution of the two external resistors of the current mode driver 300 depicted in FIG. 3 with the transistor switching mechanism reduces the power required to operate the circuit 500. No longer is power lost by driving external resistors. This yields an overall improvement in efficiency over the embodiment illustrated in FIG. 3.

Referring again to FIG. 5, current sources 401 and 403 are cross coupled as they are in the embodiments of FIGS. 2–4 discussed above. The use of such cross coupling further minimizes the power consumption of the circuit 500. However, one drawback is an increase in distortion. As a result, biasing resistors 521 and 523 couple between the resistive load 405 and the power supply $V_{DD}$. These resistors are internal resistors, and differ from the external resistors in the previous embodiment in that they are not used to pull current to generate a voltage across the load 405. Instead, the biasing resistors 521 and 523 provide a high impedance path for the remaining current to flow when the switches are in a standby mode.

Referring to the right half of the current mode driver circuit 500, the topology mirrors that of the left half. Transistors 525, 527, 529, 531, and 533 make up the second current source 403. The drain of transistor 525 couples to a reference node 535, which conducts the second current signal $I_{IN-}$, which is 180 degrees out of phase from the first current signal $I_{IN+}$. The gate of transistor 525 couples to its drain and to the gate of transistor 527. The drain of transistor 527 couples to the voltage supply $V_{DD}$. The source of transistor 525 couples to the drain of transistor 529. The drain of transistor 531 couples to its gate and the gate of transistor 529. The sources of both transistors 529 and 531 couple to ground. The gates of transistors 525 and 527 couple together, and the gates of transistors 529 and 531 couple together as well as to the output transistor 533. Only transistor 533 is used at the output to maximize voltage swing. The drain of transistor 533 couples to one end of the load 405, and its source couples to circuit ground.

In this configuration, during one half of a signal cycle, between t1 and t2 and between t4 and t5 as shown in FIG. 10, only the right half of the current mode driver circuit 400 is active. A control voltage is sensed off the gate of output transistor 533 to control transistors 537, 539, 541, and 543 which amplify and shape signal $I_{IN-}$. The gates of transistors 537 and 533 couple together and to the drain of transistor 539. The gate of transistor 539 couples to the drain of transistor 537, and the sources of both transistors 537 and 539 couple to ground. By providing transistors 537, 539 and 541 in a feedback arrangement, once the this right half of the circuit is active (i.e, when current source 403 is active), transistor 537 turns on, which turns on transistor 539, which turns on transistor 541. Transistors 537, 539, and 541 provide high gain to amplify the control voltage until it is sufficient to turn on large output transistor 543.

The switching function of resistor 407 of FIG. 4 is performed by P-channel MOS transistor 543 in parallel with resistor 523. As a result, this transistor 543 functions like transistor 519 on the left half of the current mode driver circuit 500. The drain of transistor 537 and the gate of transistor 539 couple to the drain of transistor 541 and to the gate of transistor 543. The sources of P-channel MOS transistors 541 and 543 couple to voltage source $V_{DD}$. The drain of transistor 543 couples to the opposite end of the load 405 as does the output transistor 533 of the second current source 403.

FIGS. 6–9 illustrate alternate schematic diagrams of the embodiment of the current mode driver circuit 400. The schematic diagrams of these circuits are similar to that depicted in FIG. 5 except for the amplification and shaping configurations. As a result, these figures illustrate different techniques of varying resistance to minimize the power requirements.

Figure 6:
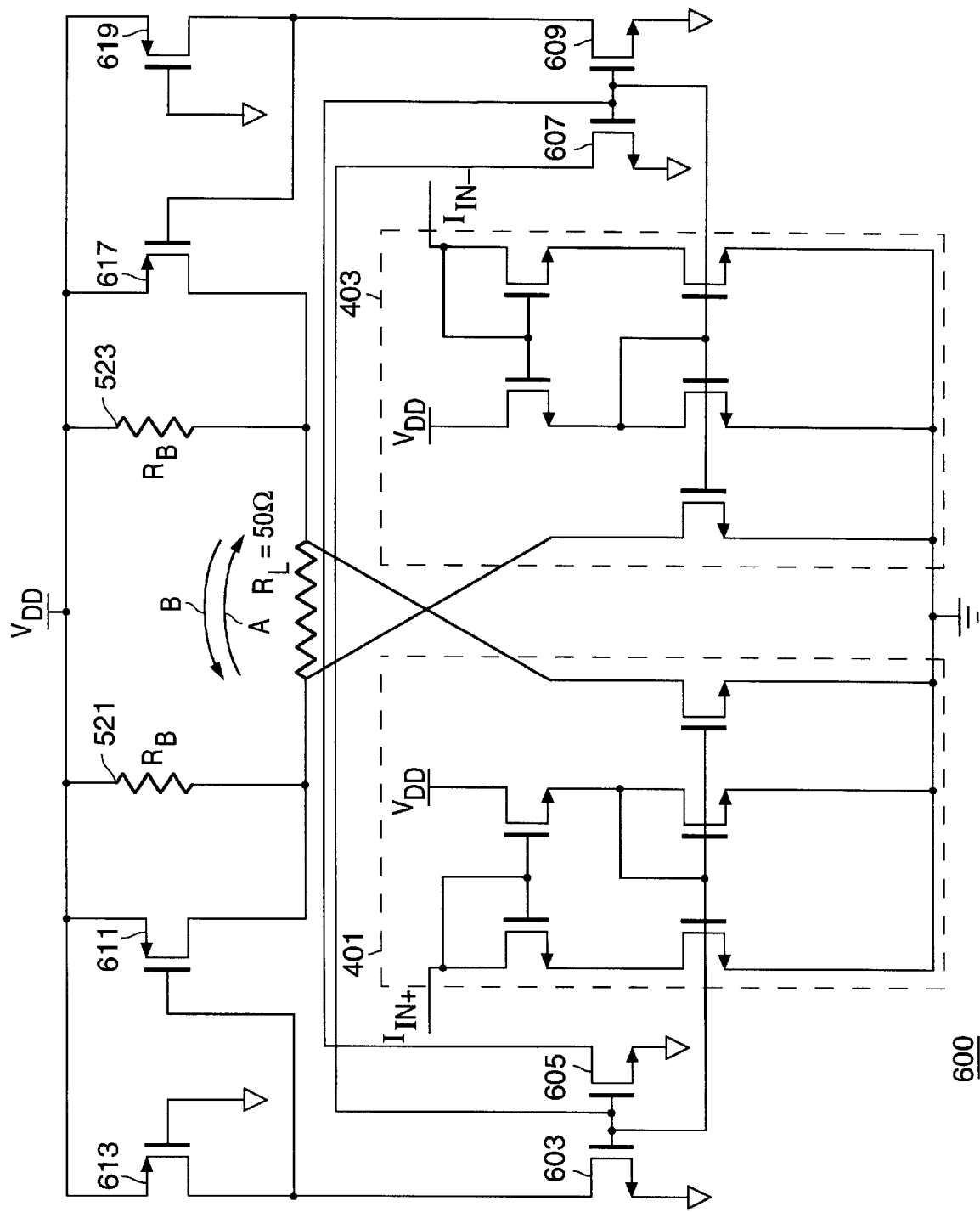

Referring to FIG. 6, the current mode driver circuit 600 operates similar to the current mode driver circuit 400 of FIG. 4. A signal generator provides the signals $I_{IN+}$ and $I_{IN-}$ to the current sources 401 and 403, respectively. When the first current source 401 is active, the left half of the circuit 600 provides a voltage drop across the load resistor 615 in the direction shown by arrow A, where the preferred value of the load resistor is 50 ohms. When the second current source 403 is active, the right half of the circuit 600 provides a voltage drop across the load resistor 615 in the direction of arrow B, such that a complete waveform is generated across the load 615.

Referring to the left half of the circuit, the first current signal $I_{IN+}$ is input into the first current source 401. The output signal from the first current source 401 is then amplified by transistors 603, 605, and 613. The first current source 401 couples to the gates of transistors 603 and 605, which couple together, and to the drain of transistor 607. The sources of transistors 603 and 605 couple to circuit ground. The output of the current source 401 couples to one end of the resistive load 615.

One key difference between this embodiment and the embodiment depicted in FIG. 5 is the shaping of the input signals $I_{IN\pm}$. With this topology, the current mode driver circuit 600 provides less distortion than the current mode driver circuit 500; however, it consumes more power.

On the left half of the circuit 600 the switch transistor 611 is configured in the same manner as switch transistor 519 of the embodiment depicted in FIG. 5. However, amplifying transistor 613 is configured differently than amplifying transistor 517 of FIG. 5. Rather than the gate of transistor 613 coupling to the gate of transistor 603 and the drain of transistor 605, the gate of transistor 613 couples to ground. Additionally, the drain of transistor 603 couples to the gate of transistor 611 and the drain of transistor 613. The sources of both transistors 611 and 613 couple to the voltage supply $V_{DD}$ and the drain of transistor 611 couples to one end of the load resistor 615.

Similarly on the $I_{IN-}$ half of the circuit, the second current source 403 couples to the gates of transistors 607 and 609, and to the drain of transistor 605. The sources of transistors 607 and 609 couple to ground. The drain of transistor 609 couples to the gate of transistor 617 and the drain of transistor 619. The sources of both transistors 617 and 619 couple to the voltage supply $V_{DD}$, the gate of transistor 619 couples to ground, and the drain of transistor 617 couples to the other end of the load 615. The circuit also includes two small biasing resistors 521 and 523 coupled to either side of the resistive load 615.

Figure 7:
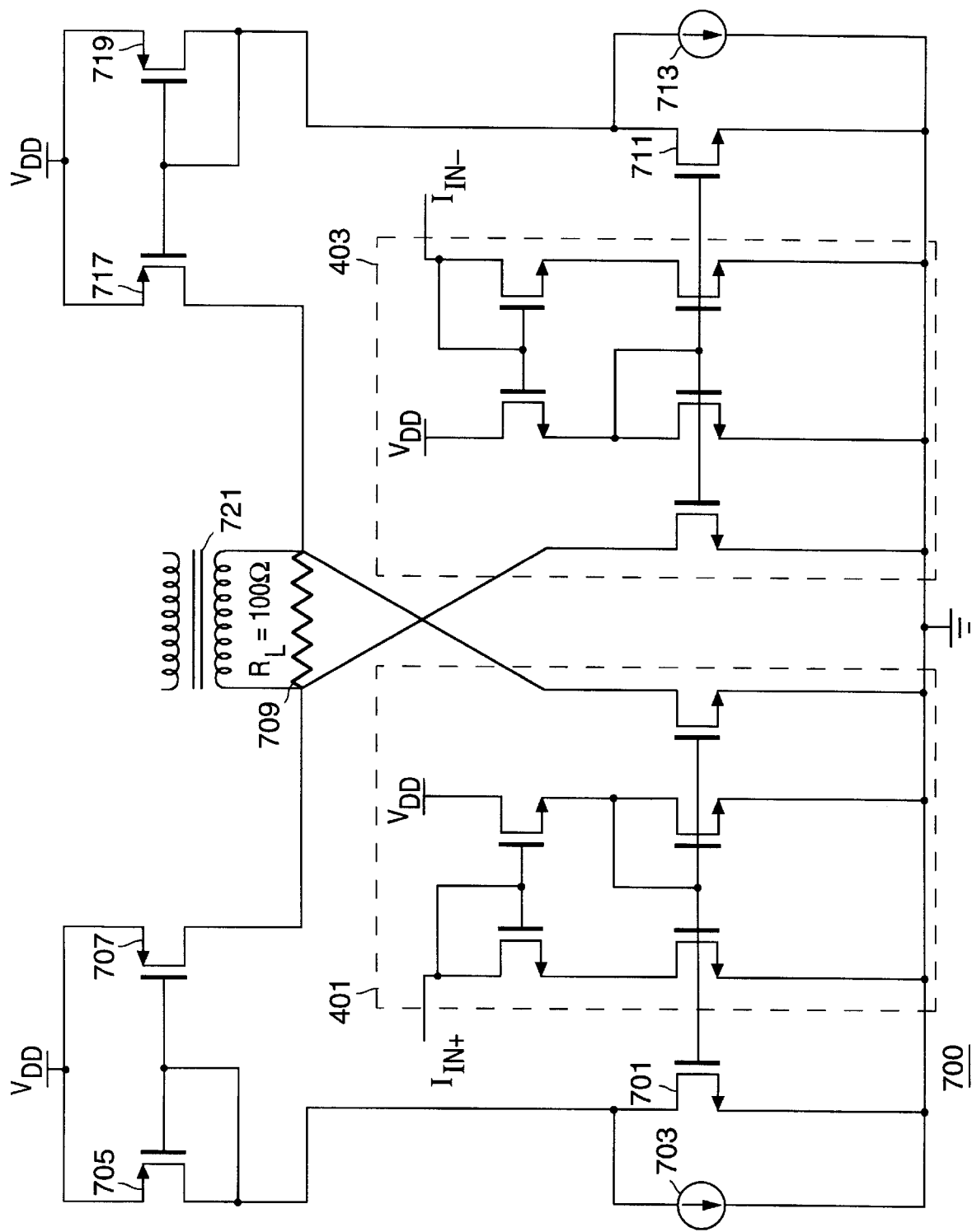

FIG. 7 depicts yet another embodiment of the present invention, which provides an alternate varying resistive technique. This is an intermediate circuit design. The cross coupling of the current sources 401 and 403 provides very low power operation, but yields higher distortion.

In this embodiment, once a control voltage is sensed off the gate of the output transistor of the current source 401, transistor 701 turns on. A bias current source 703 couples between the source and the drain of transistor 701. The drain of transistor 701 couples to the gate and source of transistor 705 and the gate of transistor 707. Both transistors 705 and 707 are P-channel MOS transistors and operate such that when transistor 701 is turned on, it can subsequently turn on transistor 705, which will turn on transistor 707. This transistor 707 functions as a switch to pull current through the resistive load 709 of the primary winding of the isolation transformer 721.

Similarly, on the other side of the circuit 700, once a control voltage is sensed off the gate of the output transistor of current source 403, transistor 711 turns on. A bias current source 713 couples between the source and the drain of transistor 711. The drain of transistor 711 couples to the gate and drain of transistor 715 and the gate of transistor 717. The source of transistor 717 couples to the power source $V_{DD}$ and the drain couples to one end of the load 709. Both transistors 715 and 717 are P-channel MOS transistors and operate such that when transistor 711 is turned on, it subsequently turns on transistor 715, which turns on transistor 717. This transistor 717 functions as a switch to pull current through the resistive load 709.

Figure 8:
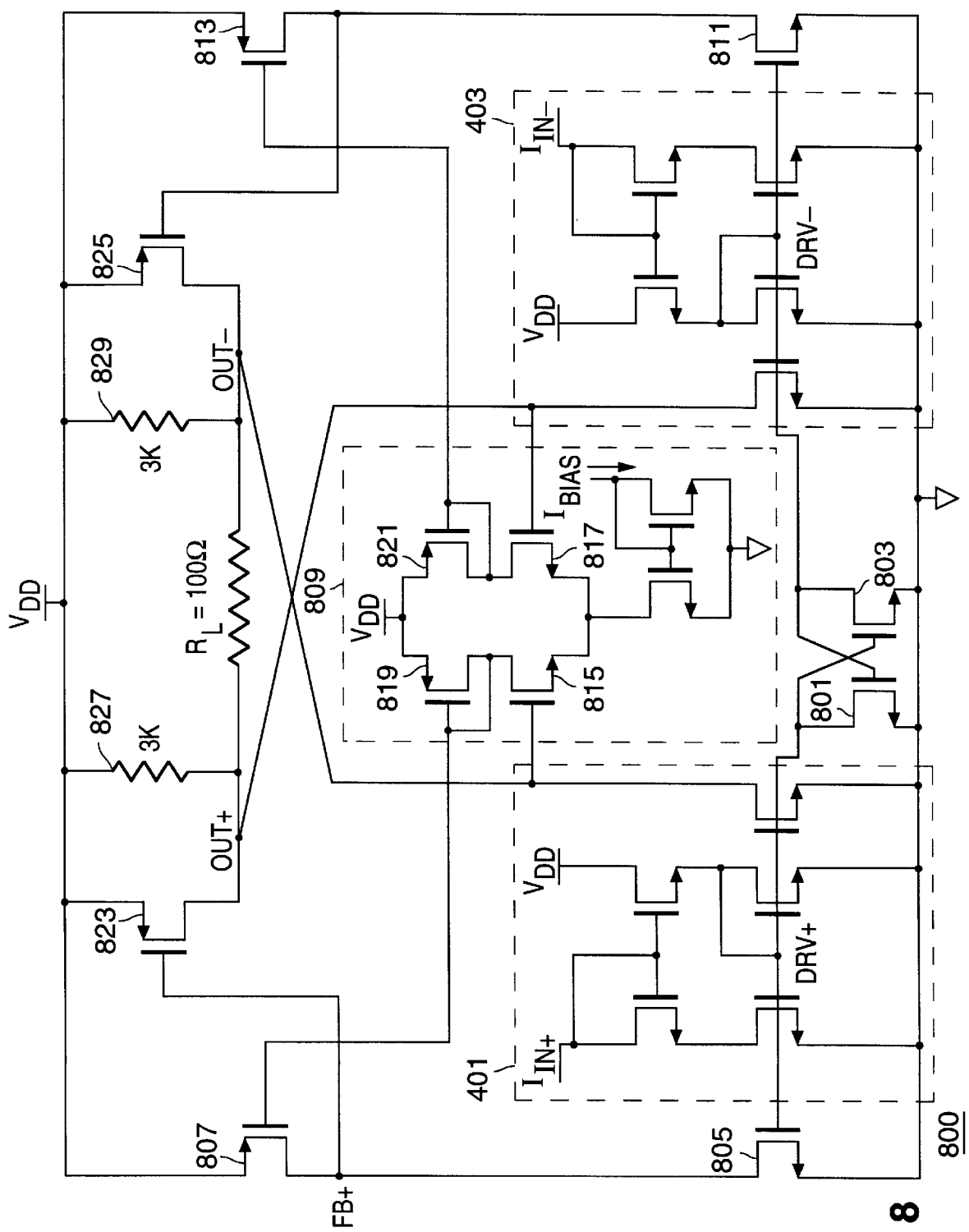

FIG. 8 illustrates yet another embodiment of the present invention, which includes a comparator 809 coupled to the output nodes OUT+, OUT− of the circuit 800. The comparator 809 compares the output voltage level at node OUT+ with the output voltage level at node OUT−, to determine which of the output voltage levels is rising. Once the comparator makes this determination, the comparator turns off the corresponding switching transistor 807 or 813. Thus, once the switching has taken place, by sampling the output, the comparator can determine when the output has changed and turn off the corresponding transistor 807, 813. For example, for the output voltage of the left half of the circuit to be able to rise, the gate of the output transistor switch 807, and therefore node FB+ must go to zero. Thus, once the comparator determines that the output voltage at node OUT− is rising, it shuts off transistor 807 such that FB+ goes to zero.

This circuit configuration 800 provides several advantages. First the circuit improves distortion. Second, the circuit saves power. Sometimes circuits may draw an undesirable amount of current if the amplifying transistors do not turn off all the way or if they leak too much current. Providing comparator 809 in the circuit 800 to turn off these transistors after the switching has taken place prevents such undesirable current draw and therefore, saves power.

The comparator 809 includes two NMOS transistors 815 and 817 configured as a differential pair. The sources of the differential pair couple to the output of current source 814 having an input current $I_{BIAS}$. In a preferred embodiment, the current source 814 is a conventional current mirror current source. The gate of transistor 815 couples to the output of current source 401 and to the output of the right half of the circuit 800 at node OUT−. The gate of transistor 817 couples to the output of current source 403 and to the output of the left half of the circuit 800, at node OUT+. The drain of transistor 815 couples to the drain and gate of PMOS transistor 819. The drain of transistor 817 couples to the drain and gate of PMOS transistor 821. The sources of the PMOS transistors 819, 821 couple to VDD. The gate of transistor 819 couples to the gate of transistor 807, and the gate of transistor 821 couples to the gate of transistor 813.

In this embodiment, the output of the current sources 401 and 403 couple to an additional cross-coupled transistor circuit. Output transistors of current sources 401 and 403 couple to the drains and gates of transistors 801 and 803. The sources of transistors 801 and 803 couple to ground.

The amplifying transistor 805 couples to the output node DRV+ of current source 401, and amplifying transistor 811 couples to the output node DRV− of current source 403. The drain of transistor 807 couples to the gate of transistor 823, and the drain of transistor 813 couples to the gate of transistor 825. Resistor 827, having a preferred value of 3K ohms, is in parallel with transistor 823, and resistor 829, having a preferred value of 3K ohms, is in parallel with transistor 825.

Figure 9:
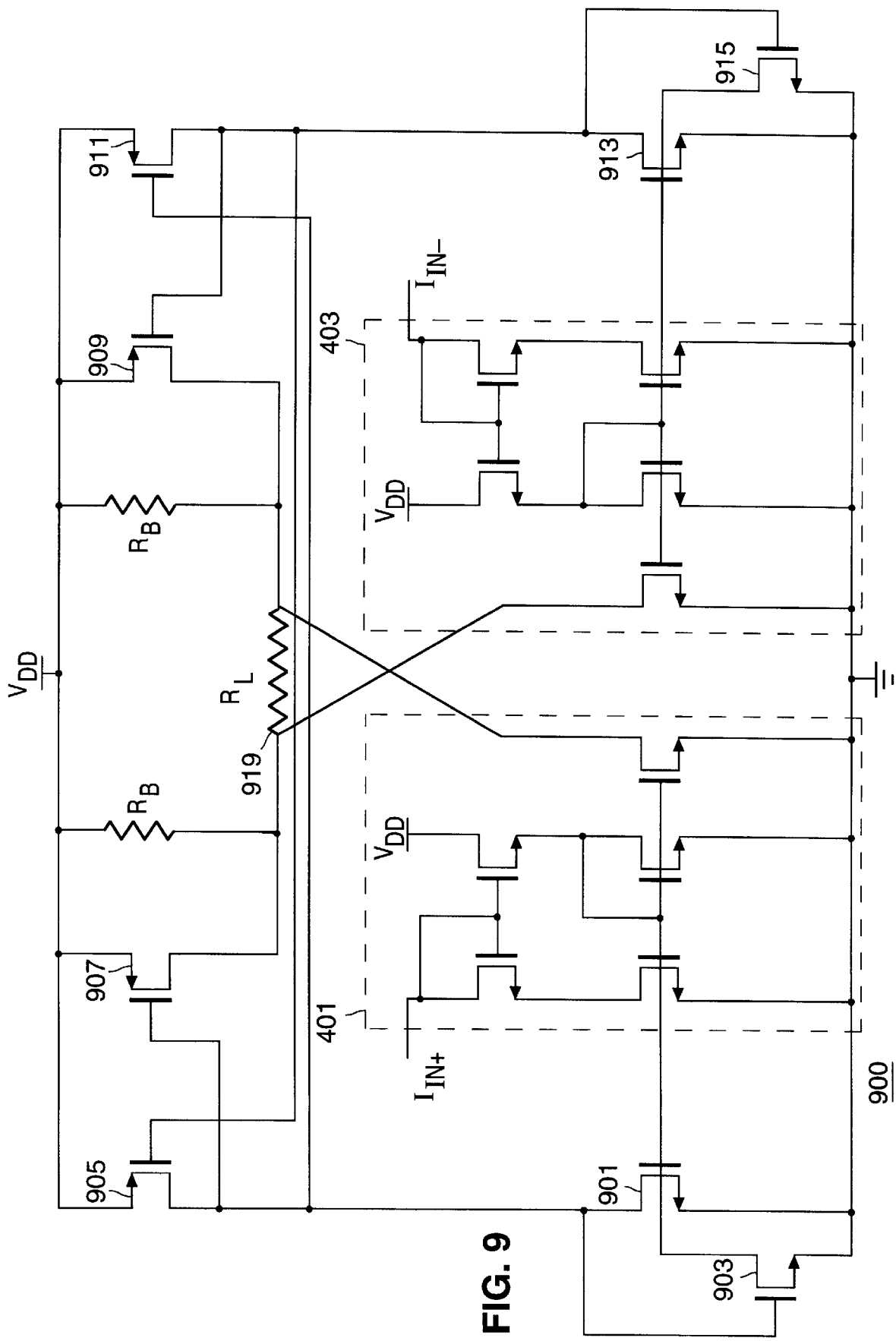

FIG. 9 illustrates yet another embodiment of the present invention, which provides an alternate varying resistive technique. In this embodiment, on the left half of the current mode driver circuit 900, the amplifying transistors 901 and 903 are configured such that the gate of transistor 901 and the drain of transistor 903 couple to the output of the current source 401. The sources of the transistors 901 and 903 couple to circuit ground, and the gate of transistor 903 couples to the drain of transistor 901.

The voltage sensed off the gate of the current source 401 output transistor, is amplified and output by transistor 901 so as to control transistors 903, 905, 907 and 911 when this half of the circuit is active. The switch transistor 907 is a P-channel MOS transistor and operates such that once transistors 901 and 903 are turned on, they can subsequently turn on transistor 911, which turns on transistor 905, which turns on transistor 907. The drain of transistor 901 couples to the drain of transistor 905, and the gates of transistors 903 and 907. The gate of transistor 905 couples to the drain of transistor 911 and the gate of transistor 909.

Similarly, on the right half of current mode driver circuit 900, amplifying transistors 913 and 915 are configured such that the gate of transistor 913 and the drain of the transistor 915 couple to the output of the current source 403. The sources of the transistors 913 and 915 couple to circuit ground, and the gate of transistor 915 couples to the drain of transistor 913.

The voltage sensed off the gate of the current source 403 output transistor is amplified and output by transistor 913 so as to control transistors 905 and 911. These transistors then turn on large transistor 909 to pull current through the load resistor 919 when this half of the circuit is active. The drain of transistor 913 couples to the drain of transistor 911 and the gates of transistors 905, 909 and 915. This configuration provides both low distortion and low power consumption while still maintaining the speed to quickly turn on and off switch transistors 907 and 909.

Various other modifications and alterations in the structure and method of operation of this invention will be apparent to those skilled in the art without departing from the scope and spirit of this invention. Although the invention has been described in connection with specific preferred embodiments, it should be understood that the invention as claimed should not be unduly limited to such specific embodiments.

What is claimed is:

1. An apparatus including a differential current driving circuit for providing a differential signal to a load, said differential current driving circuit comprising:

first and second output nodes configured to couple to an external circuit and convey first and second drive currents;

a first current sinking circuit, coupled to said first output node, configured to receive a first input signal and in accordance therewith sink said first drive current, wherein said first drive current is proportional to said first input signal and said first input signal has a first signal polarity and includes active and inactive signal states; and a second current sinking circuit, coupled to said second output node, configured to receive a second input signal and in accordance therewith sink said second drive current, wherein said second drive current is proportional to said second input signal and said second input signal has said first signal polarity and includes active and inactive signal states;

wherein:

said first input signal active signal state is contemporaneous with said second input signal inactive signal state;

said first input signal inactive signal state is contemporaneous with said second input signal active signal state; and said first and second drive currents together form at said first and second output nodes a differential output signal which is proportional to a sum of said first input signal and an inverse of said second input signal.

2. The apparatus of claim 1, wherein said first current sinking circuit comprises a current mirror circuit.

3. The apparatus of claim 1, wherein said first current sinking circuit comprises:

a current mirror circuit configured to receive said first input signal and in accordance therewith provide an output drive signal; and an output driver circuit, coupled to said current mirror circuit, configured to receive said output drive signal and in accordance therewith sink said first drive current.

4. The apparatus of claim 1, further comprising:

a first circuit, coupled to said second output node, configured to convey said first drive current to said second output node; and a second circuit, coupled to said first output node, configured to convey said second drive current to said first output node.

5. The apparatus of claim 4, wherein said first and second circuits comprise first and second resistive circuits configured to convey said first and second drive currents, respectively, and further comprising a third resistive circuit coupled between said first and second output nodes and configured to further convey said first and second drive currents and thereby provide said differential output signal.

6. The apparatus of claim 4, wherein:

said first current sinking circuit is further configured to provide a first control signal in accordance with said first input signal; and said first circuit is coupled to said first current sinking circuit and is further configured to receive said first control signal and in accordance therewith convey said first drive current to said second output node.

7. The apparatus of claim 6, wherein said first circuit comprises a selectively conductive circuit with first and second conductivities which are established in accordance with said first control signal and correspond to said active and inactive signal states of said first input signal, respectively, and wherein said first conductivity is higher than said second conductivity.

8. The apparatus of claim 6, wherein:

said second current sinking circuit is further configured to provide a second control signal in accordance with said second input signal; and said second circuit is coupled to said second current sinking circuit and is further configured to receive said second control signal and in accordance therewith convey said second drive current to said first output node.

9. The apparatus of claim 8, wherein:

said first circuit comprises a first selectively conductive circuit with first and second conductivities which are established in accordance with said first control signal and correspond to said active and inactive signal states of said first input signal, respectively;

said second circuit comprises a second selectively conductive circuit with third and fourth conductivities which are established in accordance with said second control signal and correspond to said active and inactive signal states of said second input signal, respectively;

said first conductivity is higher than said second conductivity; and said third conductivity is higher than said fourth conductivity.

10. The apparatus of claim 4, wherein:

said first circuit comprises a first current sourcing circuit configured to receive a third input signal and in accordance therewith provide said first drive current;

said third input signal has a second signal polarity which is opposite of said first signal polarity and includes active and inactive signal states;

said third input signal active signal state is contemporaneous with said first input signal active signal state; and said third input signal inactive signal state is contemporaneous with said first input signal inactive signal state.

11. The apparatus of claim 10, further comprising a bias current source coupled between said first current sinking circuit and said first current sourcing circuit and configured to provide a bias current.

12. The apparatus of claim 10, wherein:

said second circuit comprises a second current sourcing circuit configured to receive a fourth input signal and in accordance therewith provide said second drive current;

said fourth input signal has said second signal polarity and includes active and inactive signal states;

said fourth input signal active signal state is contemporaneous with said second input signal active signal state; and said fourth input signal inactive signal state is contemporaneous with said second input signal inactive signal state.

13. The apparatus of claim 12, further comprising:

a first bias current source coupled between said first current sinking circuit and said first current sourcing circuit and configured to provide a first bias current; and a second bias current source coupled between said second current sinking circuit and said second current sourcing circuit and configured to provide a second bias current.

14. The apparatus of claim 12, further comprising a differential signal driver coupled to said first and second current sinking circuits and said first and second current sourcing circuits and configured to receive a differential input signal and in accordance therewith provide said first, second, third and fourth input signals.

15. A method of providing a differential signal to a load, said method comprising the steps of:

conveying first and second drive currents via first and second output nodes which are coupled to an external circuit;

receiving a first input signal and in accordance therewith sinking said first drive current, wherein said first drive current is proportional to said first input signal and said first input signal has a first signal polarity and includes active and inactive signal states; and receiving a second input signal and in accordance therewith sinking said second drive current, wherein said second drive current is proportional to said second input signal and said second input signal has said first signal polarity and includes active and inactive signal states;

wherein:

said first input signal active signal state is contemporaneous with said second input signal inactive signal state;

said first input signal inactive signal state is contemporaneous with said second input signal active signal state; and said first and second drive currents together form at said first and second output nodes a differential output signal which is proportional to a sum of said first input signal and an inverse of said second input signal.

16. The method of claim 15, wherein said step of receiving a first input signal and in accordance therewith sinking said first drive current comprises receiving said first input signal and in accordance therewith sinking said first drive current with a current mirror circuit.

17. The method of claim 15, wherein said step of receiving a first input signal and in accordance therewith sinking said first drive current comprises:

receiving said first input signal with a current mirror circuit and in accordance therewith generating an output drive signal; and receiving said output drive signal with an output driver circuit and in accordance therewith sinking said first drive current.

18. The method of claim 15, wherein said step of conveying first and second drive currents via first and second output nodes which are coupled to an external circuit comprises:

conveying said first drive current to said second output node via a first circuit; and conveying said second drive current to said first output node via a second circuit.

19. The method of claim 18, wherein:

said step of conveying said first drive current to said second output node via a first circuit comprises conveying said first drive current to said second output node via a first resistive circuit;

said step of conveying said second drive current to said first output node via a second circuit comprises conveying said second drive current to said first output node via a second resistive circuit; and further comprising the step of further conveying said first and second drive currents via a third resistive circuit coupled between said first and second output nodes and thereby generating said differential output signal.

20. The method of claim 18, wherein:

said step of receiving a first input signal and in accordance therewith sinking said first drive current comprises generating a first control signal in accordance with said first input signal; and said step of conveying said first drive current to said second output node via a first circuit comprises receiving said first control signal and in accordance therewith conveying said first drive current to said second output node.

21. The method of claim 20, wherein said step of conveying said first drive current to said second output node via a first circuit comprises:

establishing, in accordance with said first control signal, first and second conductivities of a selectively conductive circuit which correspond to said active and inactive signal states of said first input signal, respectively, wherein said first conductivity is higher than said second conductivity; and conveying said first drive current to said second output node via said selectively conductive circuit.

22. The method of claim 20, wherein:

said step of receiving a second input signal and in accordance therewith sinking said second drive current comprises generating a second control signal in accordance with said second input signal; and said step of conveying said second drive current to said first output node via a second circuit comprises receiving said second control signal and in accordance therewith conveying said second drive current to said first output node.

23. The method of claim 22, wherein:

said step of conveying said first drive current to said second output node via a first circuit comprises establishing, in accordance with said first control signal, first and second conductivities of a first selectively conductive circuit which correspond to said active and inactive signal states of said first input signal, respectively, wherein said first conductivity is higher than said second conductivity, and conveying said first drive current to said second output node via said first selectively conductive circuit; and said step of conveying said second drive current to said first output node via a second circuit comprises establishing, in accordance with said second control signal, third and fourth conductivities of a second selectively conductive circuit which correspond to said active and inactive signal states of said second input signal, respectively, wherein said third conductivity is higher than said fourth conductivity, and conveying said second drive current to said first output node via said second selectively conductive circuit.

24. The method of claim 18, wherein said step of conveying said first drive current to said second output node via a first circuit comprises receiving a third input signal and in accordance therewith generating said first drive current, wherein:

said third input signal has a second signal polarity which is opposite of said first signal polarity and includes active and inactive signal states;

said third input signal active signal state is contemporaneous with said first input signal active signal state; and said third input signal inactive signal state is contemporaneous with said first input signal inactive signal state.

25. The method of claim 24, further comprising the step of conducting a bias current during said steps of:

receiving a first input signal and in accordance therewith sinking said first drive current; and receiving a third input signal and in accordance therewith generating said first drive current.

26. The method of claim 24, wherein said step of conveying said second drive current to said first output node via a second circuit comprises receiving a fourth input signal and in accordance therewith generating said second drive current, wherein:

said fourth input signal has said second signal polarity and includes active and inactive signal states;

said fourth input signal active signal state is contemporaneous with said second input signal active signal state; and said fourth input signal inactive signal state is contemporaneous with said second input signal inactive signal state.

27. The method of claim 26, further comprising:

the step of conducting a first bias current during said steps of receiving a first input signal and in accordance therewith sinking said first drive current, and receiving a third input signal and in accordance therewith generating said first drive current; and the step of conducting a second bias current during said steps of receiving a second input signal and in accordance therewith sinking said second drive current, and receiving a fourth input signal and in accordance therewith generating said second drive current.

28. The method of claim 26, further comprising the step of receiving a differential input signal and in accordance therewith generating said first, second, third and fourth input signals.

* * * * *